United States Patent
Lee et al.

(10) Patent No.: US 7,812,342 B2
(45) Date of Patent: Oct. 12, 2010

(54) THIN FILM TRANSISTOR HAVING A NANO SEMICONDUCTOR SHEET AND METHOD OF MANUFACTURING THE SAME

(75) Inventors: Sang-Min Lee, Suwon-si (KR); Nam-Choul Yang, Suwon-si (KR)

(73) Assignee: Samsung Mobile Display Co., Ltd. (KR)

( * ) Notice: Subject to any disclaimer, the term of this patent is extended or adjusted under 35 U.S.C. 154(b) by 814 days.

(21) Appl. No.: 11/510,454

(22) Filed: Aug. 25, 2006

(65) Prior Publication Data
US 2007/0052024 A1 Mar. 8, 2007

(30) Foreign Application Priority Data
Aug. 30, 2005 (KR) ............... 10-2005-0080021

(51) Int. Cl.
*H01L 51/00* (2006.01)
(52) U.S. Cl. ............... 257/40; 977/755; 257/E51.005
(58) Field of Classification Search ............... 977/938, 977/721, 730, 755; 257/40
See application file for complete search history.

(56) References Cited

U.S. PATENT DOCUMENTS

| | | | | |
|---|---|---|---|---|
| 6,007,969 | A * | 12/1999 | Hatakeyama et al. | 430/323 |
| 6,326,311 | B1 * | 12/2001 | Ueda et al. | 438/694 |
| 6,679,998 | B2 * | 1/2004 | Knappenberger et al. | 216/42 |
| 7,083,104 | B1 * | 8/2006 | Empedocles et al. | 235/491 |
| 7,129,554 | B2 * | 10/2006 | Lieber et al. | 257/414 |
| 7,190,049 | B2 * | 3/2007 | Tuominen et al. | 257/618 |
| 7,262,501 | B2 * | 8/2007 | Duan et al. | 257/750 |
| 7,323,730 | B2 * | 1/2008 | Borghetti et al. | 257/290 |
| 7,385,267 | B2 * | 6/2008 | Lieber et al. | 257/414 |
| 2001/0016283 | A1 * | 8/2001 | Shiraishi et al. | 429/218.2 |

(Continued)

FOREIGN PATENT DOCUMENTS

JP 2004-048062 2/2004

OTHER PUBLICATIONS

C. Dekker, "Carbon Nanotubes As Molecular Quantum Wires", Physics Today, May 1999, American Institute of Physics; pp. 22-28.*

(Continued)

*Primary Examiner*—W. David Coleman
(74) *Attorney, Agent, or Firm*—Knobbe Martens Olson & Bear LLP

(57) ABSTRACT

Provided are a nano semiconductor sheet, a thin film transistor (TFT) using the nano semiconductor sheet, and a flat panel display using nano semiconductor sheet. The nano semiconductor sheet has excellent characteristics, can be manufactured at room temperature, and has good flexibility. The nano semiconductor sheet includes: a first film and a second film disposed on at least one side of or inside of the first film, and includes a plurality of nano particles arranged substantially in parallel to each other. In addition, provided are a method of manufacturing a nano semiconductor sheet and methods of manufacturing a TFT and a flat panel display using the nano semiconductor sheet. The method of manufacturing a nano semiconductor sheet, includes: forming first polymer microfibers having a plurality of nano particles arranged substantially in parallel; preparing a first film; and arranging a plurality of the first micro-fibers on at least one side of or inside of the first film.

9 Claims, 9 Drawing Sheets

U.S. PATENT DOCUMENTS

| | | | |
|---|---|---|---|
| 2002/0022429 A1 | 2/2002 | Yaniv et al. | |
| 2004/0046755 A1* | 3/2004 | Okai et al. | 345/204 |
| 2004/0127012 A1* | 7/2004 | Jin | 438/618 |
| 2006/0237537 A1* | 10/2006 | Empedocles et al. | 235/439 |
| 2006/0284218 A1* | 12/2006 | Kaner et al. | 257/288 |
| 2007/0158642 A1* | 7/2007 | Gruner | 257/40 |

OTHER PUBLICATIONS

Zhong Lin Wang, Zhengwei Pan, "Junctions and Networks of SnO Nanoribbons", Aug. 5, 2002, Journal of Advanced Materials, 14, No. 15, pp. 29-1032.*

* cited by examiner

THIN FILM TRANSISTOR HAVING A NANO SEMICONDUCTOR SHEET AND METHOD OF MANUFACTURING THE SAME

CROSS-REFERENCE TO RELATED APPLICATIONS

This application claims the benefit of Korean Patent Application No. 10-2005-0080021, filed on Aug. 30, 2005, in the Korean Intellectual Property Office, the disclosure of which is incorporated herein in its entirety by reference.

BACKGROUND OF THE INVENTION

1. Field of the Invention

The present invention relates to a nano semiconductor sheet, a method of manufacturing the nano semiconductor sheet, a thin film transistor (TFT), a flat panel display device, and methods of manufacturing a TFT and a flat panel display using the nano semiconductor sheet. More particularly, the present invention relates to a nano semiconductor sheet having nano particles arranged substantially in parallel, a method of manufacturing the nano semiconductor sheet, a TFT, a flat panel display device, and methods of manufacturing a TFT and flat panel display using the nano semiconductor sheet.

2. Description of the Related Technology

Thin film transistors (TFTs) are used for various electronic devices. Among other things, flat panel displays employ TFTs for various purposes. Examples of flat panel displays include liquid crystal display (LCD), organic light emitting display (OLED), and inorganic light emitting display. TFTs may serve as pixel TFTs, for example, switching devices or pixel driving devices. TFTs may also serve as circuit TFTs.

A TFT typically includes a semiconductor layer formed on a substrate. The semiconductor layer includes drain and source regions and a channel region disposed between the source and drain regions. The TFT also includes a gate insulation layer formed on the semiconductor layer, and a gate electrode formed on a portion of the gate insulation layer above the channel region.

An organic light emitting device typically includes a light emission layer. The emission layer is typically formed of an organic material and is interposed between an anode electrode and a cathode electrode. When positive and negative voltages are respectively applied to the electrodes, holes injected from the anode electrode move through a hole transport layer to the emission layer, and electrons injected from the cathode electrode move through an electron transport layer to the emission layer. The electrons and holes are recombined in the emission layer to generate excitons in their excited state. As the excitons return to a ground state from their excited state, fluorescent light is emitted from the emission layer. A full-color organic light emitting display includes pixels emitting three colors, such as red (R), green (G), blue (B), to realize a full color image.

An active matrix type organic light emitting display requires a high resolution panel. However, several problems may occur due to the use of the above-described TFTs when they include high performance polycrystalline silicon. In a conventional active matrix type flat panel display, for example, an active matrix type organic light emitting display, a circuit TFT and a pixel TFT (in particular, a driving TFT) may include the same type of polycrystalline silicon, and thus the TFTs may have the same current mobility. However, the circuit TFT requires switching characteristics whereas the driving TFT requires low current properties which are different from the switching characteristics. That is, when both a driving TFT and a circuit TFT in a high resolution display device include polycrystalline silicon films having a high current mobility, the circuit TFT can have a high switching characteristic. However, the current flowing to an electroluminescence (EL) device through the driving TFT increases, thus causing the luminescence to be too high and increasing a current density. These problems may reduce the lifetime of the EL device.

In certain display devices, a driving TFT and a circuit TFT in a display device may be formed using an amorphous silicon film having a low current mobility. In such cases, the driving TFT may be formed to decrease the amount of a current flowing through the driving TFT to EL device, whereas the circuit TFT may be formed to increase the amount of a current flowing through the circuit TFT.

In order to solve this problem, a method of adjusting the current flowing through the driving transistor has been proposed. For example, a method of increasing the resistance of channel regions by decreasing a width-to-length ratio (W/L) of the driving transistor has been attempted. In addition, a method of increasing the resistance of channel regions by forming low concentration doped regions in source/drain regions in the driving transistor has been proposed. However, when the channel length is increased to decrease the W/L ratio, a stripe pattern is formed in the channel region and the area of an aperture decreases when crystallization is performed using excimer laser annealing (ELA). When the width is decreased to decrease the W/L ratio, there is a limitation due to the design rule of a photolithographic process and the reliability of a transistor is degraded. The method of increasing the resistance of channel regions by forming low concentration doped regions requires an additional doping process.

Meanwhile, a flat panel display may be deformed to a predetermined degree by applying a tensile force to obtain a sufficient viewing angle. A flat panel display may also be used for portable products such as arm bands, wallets, or notebook computers. Thus, there is a need to provide flat panel displays with improved flexibility.

However, when polycrystalline silicon TFTs are formed using conventional methods, flat panel display may not be made flexible. To manufacture flexible products, most components including a substrate may be formed of flexible materials, such as acryl, polyimide, polycarbonate, polyester, mylar, or other plastic materials. However, these plastic materials are susceptible to heat.

Accordingly, to manufacture TFTs for flat panel displays for flexible products, a structure which can be manufactured at a temperature which plastic materials can endure and a method performed at the temperature are required.

SUMMARY OF CERTAIN INVENTIVE ASPECTS

One aspect of the invention provides a semiconductor sheet comprising: a plurality of microfibers extending generally in a direction, the microfibers comprising nanoparticles. The nanoparticles may comprise one or more selected from the group consisting of nano wires, nano rods, and nano ribbons.

The sheet may further comprise another plurality of microfibers extending in another direction. The other direction may be substantially perpendicular to the direction. The other plurality of microfibers may comprise nanoparticles. The other plurality of microfibers may comprise substantially no nanoparticles. At least part of the other plurality of microfibers may be interwoven with at least part of the plurality of microfibers. Each of the plurality of microfibers may have a width from about 50 nm and about 5,000 nm. At least one of the microfibers may have a gap with a neighboring one of the microfibers, and wherein a gap is between about 0 μm and about 5 μm. At least one of the microfibers may contact with a neighboring one of the microfibers.

Another aspect of the invention provides an electronic device comprising: a substrate; and a thin film transistor formed over the substrate, the thin film transistor comprising a channel, a gate electrode, an insulating layer, a source, and a drain, the insulating layer being interposed between the channel and the gate electrode, wherein the channel comprises a nano semiconductor sheet comprising a plurality of microfibers extending generally in a direction, the microfibers comprising nanoparticles.

The plurality of microfibers may extend generally between the source and the drain. The nanoparticles may be aligned generally in a direction extending between the source and the drain. The plurality of microfibers may further comprise a polymer. The source and the drain may comprise nanoparticles and a trace amount of the polymer. The channel may further comprise another plurality of microfibers extending in another direction, and the other plurality of microfibers may comprise substantially no nanoparticles. The device may further comprise a photoresist layer formed on at least a portion of a surface of the channel.

Another aspect of the invention provides a method of making a thin film transistor, the method comprising: providing a substrate; placing a nano semiconductor sheet over the substrate, the sheet comprising a plurality of microfibers extending generally in a direction, the microfibers comprising nanoparticles and a polymer; selectively removing the polymer from at least one portion of the semiconductor layer so as to expose the nanoparticles in the at least one portion, thereby defining source and drain regions; and forming source and drain electrodes contacting at least part of the exposed nanoparticles in the source and drain regions.

In the method, selectively removing the polymer may comprise: forming a photoresist layer over the sheet; patterning the photoresist layer to open the source and drain regions while blocking a channel region interposed between the source and drain regions; and selectively etching the polymer from the source and drain regions while leaving the nanoparticles in the source and drain regions. The method may not comprise removing the patterned photoresist layer after selectively etching the polymer.

Another aspect of the invention provides a nano semiconductor sheet which has good characteristics and can be manufactured at room temperature, a method of manufacturing the nano semiconductor sheet, a method of manufacturing a thin film transistor (TFT) using the nano semiconductor sheet, and a method of manufacturing a flat panel display using the nano semiconductor sheet.

Yet another aspect of the invention provides a nano semiconductor sheet including: a first film; and a second film that is disposed on at least one side of or inside of the first film, and includes a plurality of nano particles arranged substantially in parallel to each other.

Another aspect of the invention provides a method of manufacturing a nano semiconductor sheet, including: forming first polymer micro-fibers having a plurality of nano particles arranged substantially in parallel; preparing a first film; and arranging a plurality of the first micro-fibers on at least one side of or inside of the first film.

Another aspect of the invention provides a TFT including: a nano semiconductor active layer that comprises a first film and a second film disposed on at least one side of or inside of the first film, and including a plurality of nano particles arranged substantially in parallel to each other, wherein a portion of the at least one nano particle is exposed in at least a portion of source and drain regions; source and drain electrodes contacting at least the exposed portion of the at least one nano particle of the nano semiconductor active layer; and a gate electrode insulated from the nano semiconductor active layer, and the source and drain electrodes.

BRIEF DESCRIPTION OF THE DRAWINGS

The above and other features and advantages of the invention will become more apparent by describing in detail exemplary embodiments thereof with reference to the attached drawings in which.

DETAILED DESCRIPTION OF CERTAIN INVENTIVE EMBODIMENTS

Figure 1:
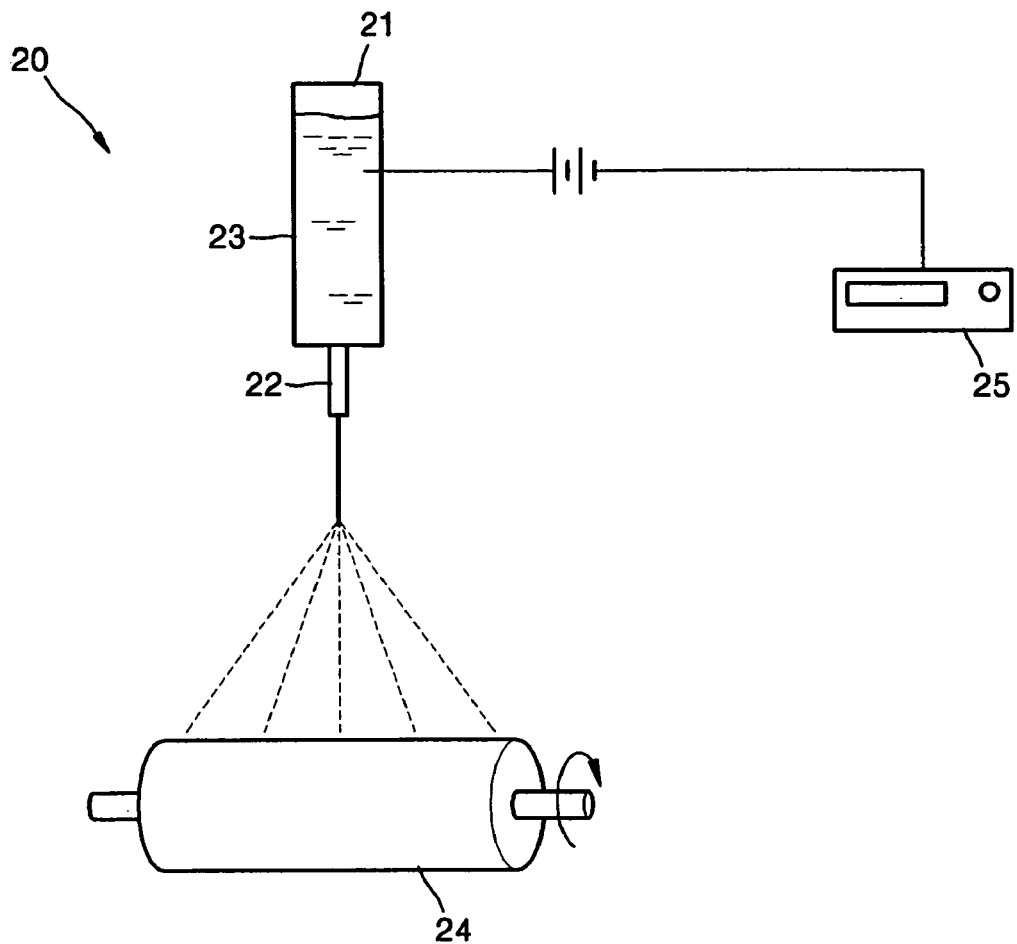
FIG. 1 is a schematic view illustrating a method of manufacturing micro-fibers having nano particles used in manufacturing a nano semiconductor sheet according to an embodiment.

Hereinafter, embodiments of the invention will be described more fully with reference to the accompanying drawings. In the drawings, like reference numerals indicate identical or functionally similar elements.

Figure 2:
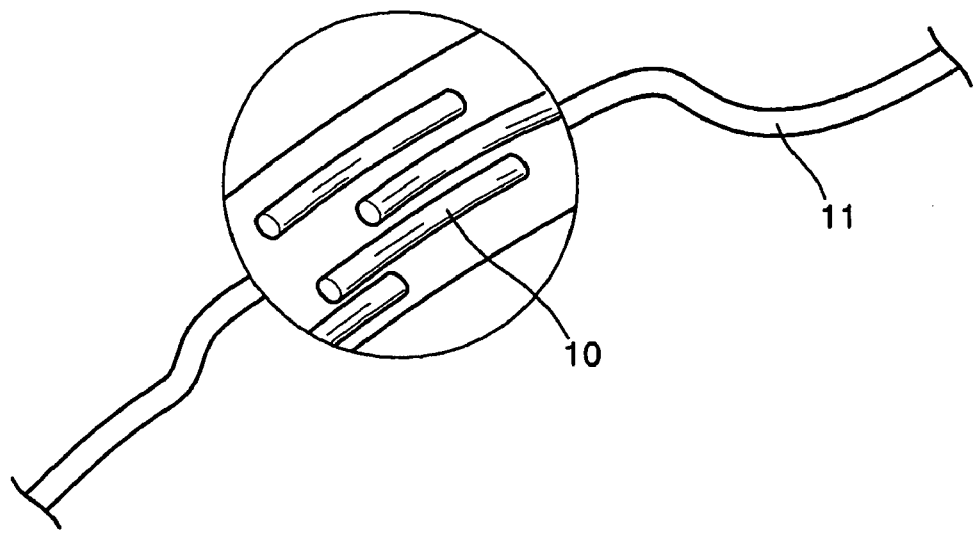
FIG. 2 illustrates first micro-fibers manufactured through the method of FIG. 1.

FIG. 1 is a schematic view illustrating a method of manufacturing micro-fibers having nano particles according to one embodiment. The micro-fibers are used in manufacturing a nano semiconductor sheet according to another embodiment. FIG. 2 illustrates micro-fibers manufactured by the method of FIG. 1.

In one embodiment, the micro-fibers 11 include a polymer and a plurality of nano scale particles 10, as shown in FIG. 2. In the illustrated embodiment, the nano particles 10 are arranged substantially in parallel to one another in the microfibers 11.

The micro-fibers 11 may be manufactured using an electrospinning method illustrated in FIG. 1. In other embodiments, the micro-fibers may be made using any suitable method. Hereinafter, a method of manufacturing the micro-fibers 11 using the electrospinning method will be described in detail.

Referring to FIG. 1, an electrospinning apparatus 20 includes an injector 21, a power supply 25 and a collector 24. The injector 21 contains a polymer solution 25. The injector 21 also has a nozzle 22 configured to spray the polymer solution 23 onto the collector 24. The power supply 25 is configured to apply high frequency electric power to the injector 21. The collector 24 rotates and forms nano-sized micro-fibers using the polymer solution 23. The polymer solution 23 is injected onto the collector 24 while high frequency electric power is applied to the polymer solution 23. Micro-fibers are formed and wound around the rotating collector 24. One of ordinary skills in the art will appreciate that the micro-fibers can be made using well-known technology in the art.

The polymer solution 23 may include a polymer and nano particles 10. The nano particles 10 may have various shapes. Examples of the nano particles 10 include nano wires, nano ribbons, nano rods, single-walled nano tubes, or multi-walled nano tubes. The nano particles 10 may be manufactured using various methods as follows.

(a) P-type silicon (Si) nano wire

In one embodiment, p-type Si nano wires may be synthesized by thermal deposition. The nano wires may have a thickness between about 20 and about 40 nm. The nano wires may be synthesized by thermal deposition of $SiH_4$ and $B_2H_6$ using commercially available mono-dispersed gold colloid particles (British Biocell International. Ltd) as a catalyst. The synthesis temperature may range from about 420° C. to about 480° C. An 8-inch tube furnace is used as a reactor and the growth inside the furnace is controlled by a computer. When the total pressure is about 30 torr, the silane partial pressure is about 2 torr. The reaction time is approximately 40 minutes. In one embodiment, the ratio of $B_2H_6$ to $SiH_4$ is about 6400:1 in consideration of a doping level. The doping concentration of the nano wires may be about $4\times10E17$ $cm^{-3}$. Since the doping level is high, the contact resistance is low even through a high temperature annealing process is not performed.

(b) N-type Si nano wire

In one embodiment, n-type Si nano wires may be synthesized using laser-assisted catalytic growth (LCG). A method of ablating a gold target using a laser beam (Nd:YAG 532 nm; pulse length of 8 ns, 300 mJ/pulse, 10 Hz) may be employed. The generated gold nanocluster catalyst particles react with $SiH_4$ gas in a reaction chamber to grow Si nano wires. In the case of n-type doping, an Au-P target (99.5:0.5 wt %, Alfa Aesar) and additional red phosphorus (99% Alfa Aesar) are supplied through a gas inlet of the reaction chamber.

(c) N-type GaN nano wire

In one embodiment, GaN nano wires may be formed through a metal-catalyzed chemical vapor deposition (CVD) method. The method may use ammonia gas (99.99%, Matheson), gallium metal (99.9999%, Alfa Aesar), magnesium nitride ($Mg_3N_2$, 99.6%, Alfa Aesar) as N, Ga, and Mg sources, respectively. C-plane sapphire may be used as a substrate. $Mg_3N_2$ is thermally decomposed into Mg and $N_2$ ($Mg_3N_2(s)=3$ $Mg(g)+N_2(g)$), and Mg dopants are generated and disposed upstream from a Ga-source. The GaN nano wires are formed at about 950° C., and nickel is used as a catalyst. The GaN nano wires have a length of about 10 to 40 μm.

(d) N-type CdS nano ribbon

In one embodiment, CdS nano ribbons may be synthesized using a vacuum vapor transport method. In particular, a small amount of CdS powder (less than about 100 mg) is placed at one end of a vacuum tube and the vacuum tube is sealed. The one end of the vacuum tube is heated to maintain the temperature of the CdS powder at about 900° C. The temperature of the other end of the vacuum tube may be maintained lower than about 50° C. Within two hours of heating, the CdS powder may be moved to the cold end of the vacuum tube and deposited on the inner wall of the vacuum tube. Most of the resultant product includes nano ribbons having a thickness of about 30 to about 150 nm, a width of about 0.5 to about 5 μm, and a length of about 10 to about 200 μm.

(e) Ge nano wire

In one embodiment, in a furnace reactor having a diameter of about 2.5 cm (total pressure=about 1 atm), $H_2$ flows at a flux of about 100 sccm (standard cubic centimeter per minute), $GeH_4$ (about 10% in He) flows at of a flux of 10 sccm. CVD may be performed at about 275° C. for about 15 minutes, and Ge nano wires are obtained. A $SiO_2$ substrate may be used as a reaction substrate. Gold nanocrystals (average diameter=about 20 nm) are uniformly dispersed on the reaction substrate.

(f) InP nano wire

In one embodiment, InP nano wires are formed using laser-assisted catalytic growth (LCG). In one embodiment, an LCG target may include about 94% InP, about 5% Au as a catalyst, and about 1% Te or Zn as a dopant. When InP nano wires grow, a furnace (middle portion) is maintained at about 800° C., and the target is disposed at an upstream end portion pf the furnace. An Nd-YAG laser beam (1064 nm wavelength) is irradiated for about 10 minutes, and then the InP nano wires are deposited in a cold downstream end portion of the furnace.

(g) ZnO nano rod

In one embodiment, approximately 29.5 g (0.13 mol) of zinc acetate dihydrate (ZnOCOCH3-2H2O) is dissolved in 125 ml of methanol at 60° C. About 14.8 g (0.23 mol) of potassium hydroxide (KOH) is dissolved in about 65 ml of methanol. These solutions are mixed and agitated at about 60° C. for several days. When nano rods are precipitated, the precipitate is washed with methanol and centrifuged at about 5500 rpm for about 30 minutes. The resulting nano particles are diluted with a solvent (ethylene glycol: water=2:1) to prepare a solution. After about 3 days of aging, nano rods having a diameter of about 15 to 30 nm and a length of about 200 to 300 nm are obtained. Alternatively, nano wires can be obtained using CVD.

Figure 3:
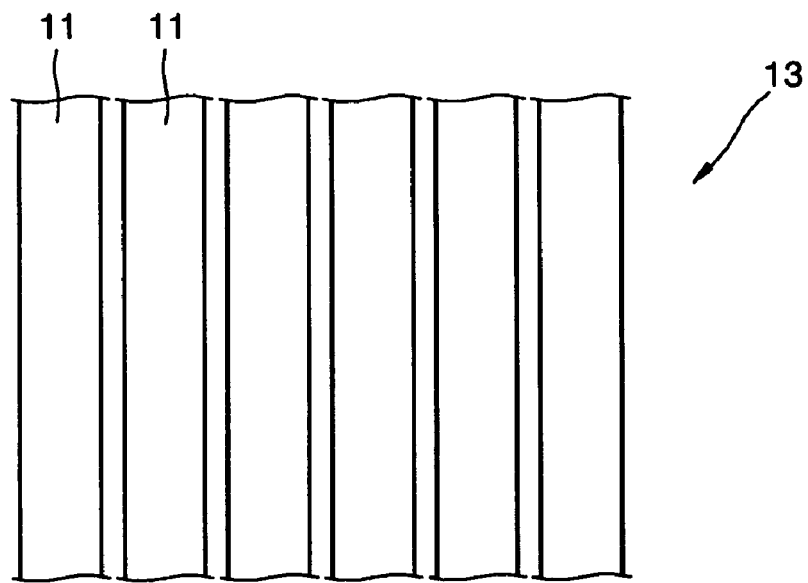
FIG. 3 is a schematic plan view of a second film having the first micro-fibers of FIG. 2 according to an embodiment.

In one embodiment, the micro-fibers 11 having the nano particles 10 may form a film. The micro-fibers 11 can be arranged substantially in parallel to one another to form a film 13, as illustrated in FIG. 3.

Figure 4:
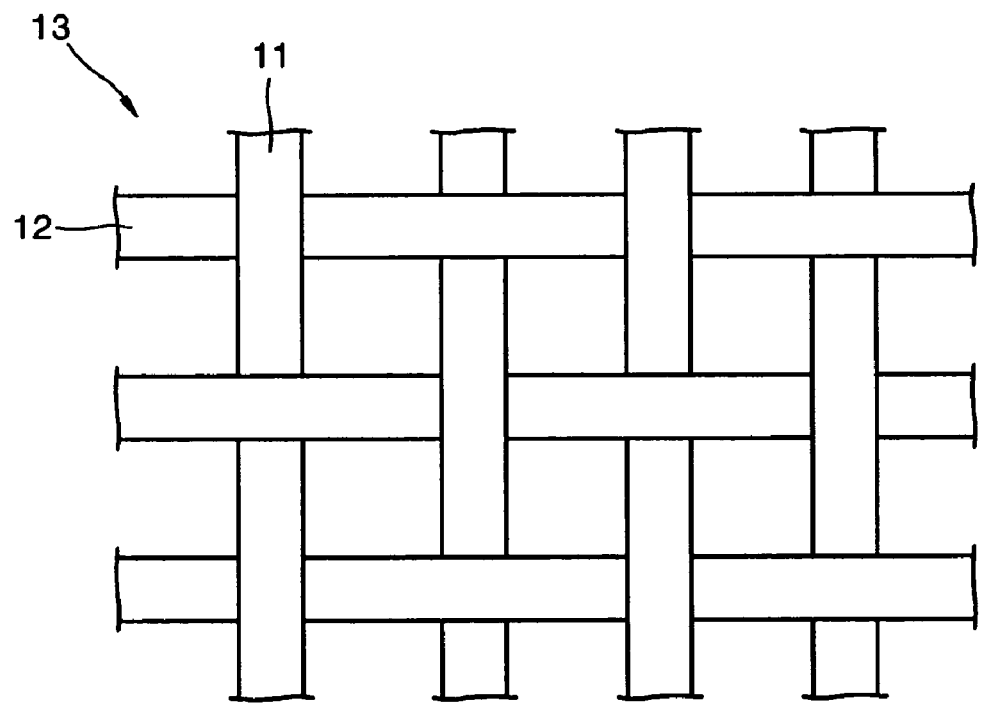
FIG. 4 is a schematic plan view of a second film having the first micro-fibers of FIG. 2 according to another embodiment.
Figure 5:
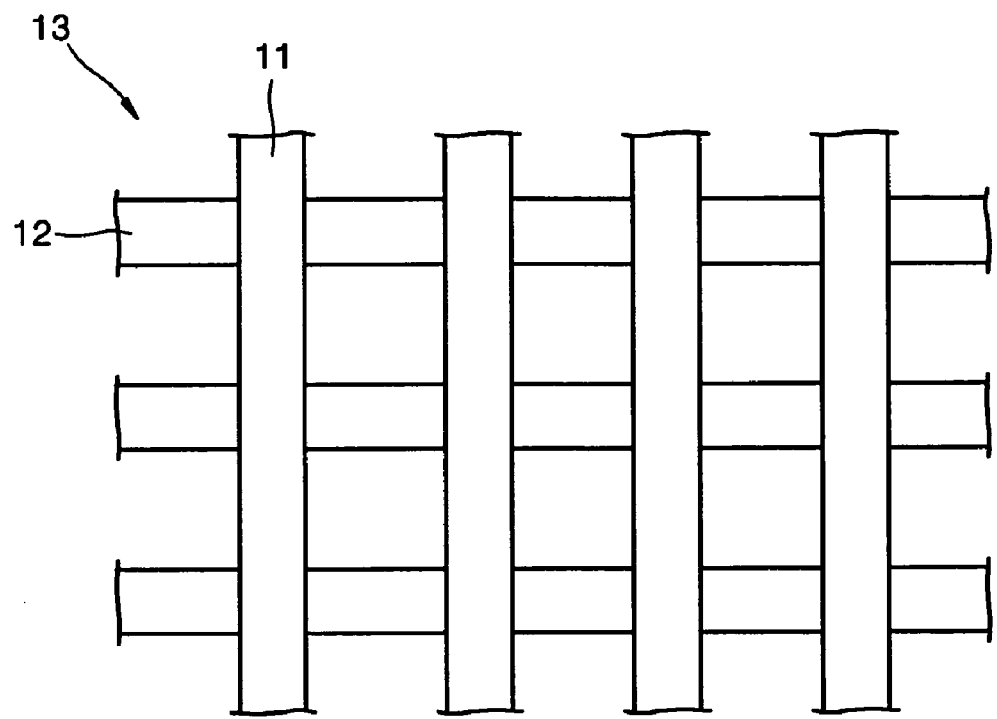
FIG. 5 is a schematic plan view of a second film having the first micro-fibers of FIG. 2 according to another embodiment.

Referring to FIGS. 4 and 5, the film 13 may have a fabric shape. In one embodiment, first micro-fibers 11 and second micro-fibers 12 are interweaved with each other, as shown in FIG. 4. In another embodiment, the first and second micro-fibers 11 and 12 cross each other, as shown in FIG. 5. In the illustrated embodiments, the first micro-fibers extend in a first direction. The second micro-fibers 12 extend in a second direction substantially perpendicular to the first direction. In the embodiments, the first micro-fibers 11 include the nano particles 10 whereas the second micro-fibers 12 have no nano particles. The micro-fibers 11 and 12 can be formed using the same method described above, and then arranged to cross each other to form the, film 13. Since only the first microfibers 11 have the nano particle 10 in the film 13, the nano particles 10 are arranged in the direction in which the first micro-fibers 11 are arranged. Accordingly, as in FIG. 3, the film 13 in which the nano particles 10 are arranged substantially in parallel to one another can be formed.

Figure 6:
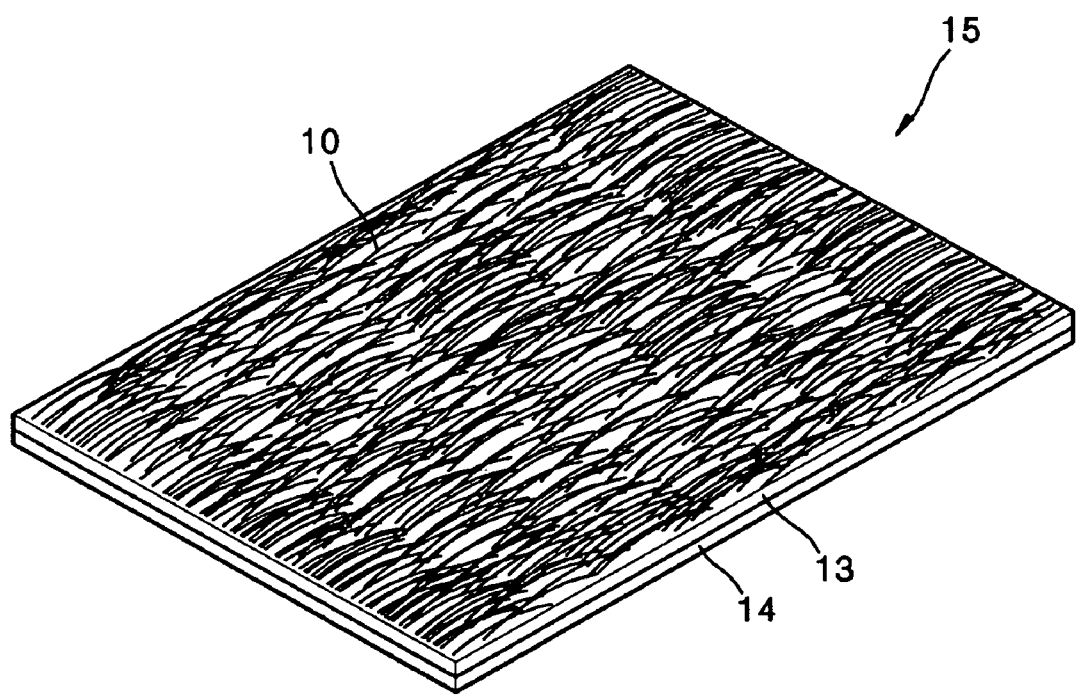
FIG. 6 illustrates a nano semiconductor sheet according to an embodiment.

In certain embodiments, a nano semiconductor sheet may be provided. Referring to FIG. 6, a nano semiconductor sheet 15 includes a first film 14 and a second film 13 adhered to the first film 14. The first film 14 serves as a base to form the nano semiconductor sheet 15. The second film 13 may be adhered to one side of the first film 14. The nano particles 10 can be disposed on a surface of or inside of the first film 14.

A method of manufacturing a TFT using the nano semiconductor sheet 15 will now be described. FIGS. 7A through 7G are cross-sectional views illustrating a method of manufacturing a top-gate type TFT according to an embodiment.

Figure 7A:
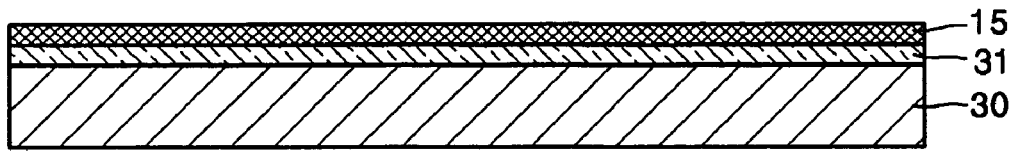
FIGS. 7A through 7G are schematic cross-sectional views illustrating a method of manufacturing a top-gate type thin film transistor (TFT) according to an embodiment of the present invention.

Referring to FIG. 7A, the nano semiconductor sheet 15 is adhered to a buffer layer 31 formed on a substrate 30. Examples of a material for the substrate 30 include, but are not limited to, acryl, polyimide, polycarbonate, polyester, mylar, or another plastic material. In certain embodiments, the substrate 30 may be formed of, for example, glass or metal. The buffer layer 31 may be optionally formed on the substrate 30 in order to prevent the diffusion of impurity ions or contact with an external gas and moisture.

Figure 7B:
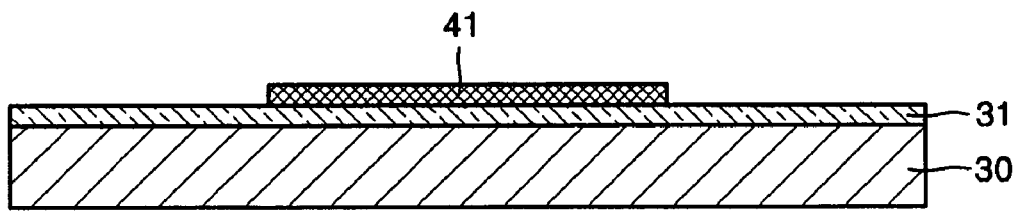
Figure 7C:
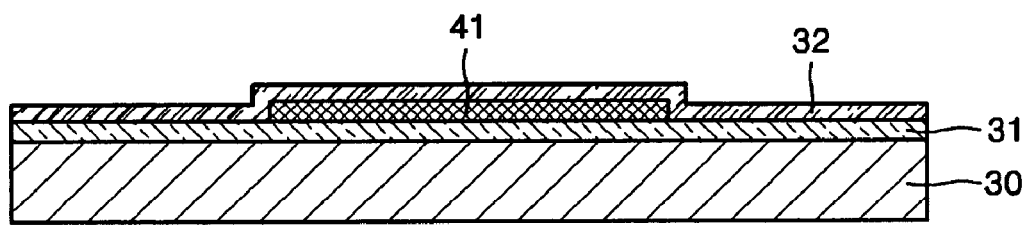

Referring to FIG. 7B, the nano semiconductor sheet 15 is patterned to obtain an active layer 41. Referring to FIG. 7C, an insulation layer 32 is formed to cover the active layer 41. The insulation layer 32 may be a photosensitive film.

Figure 7D:
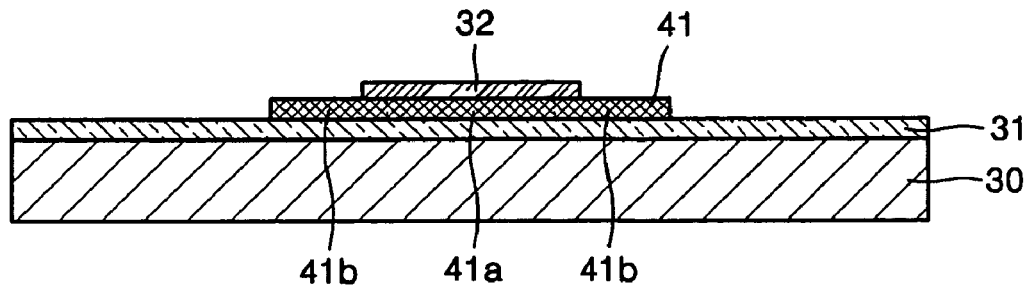

Referring to FIG. 7D, the insulation layer 32 is patterned narrower than the active layer 41. The insulation layer 32 is disposed over a channel region 41a of the active layer 41, and at least portions of source/drain regions 41b may be exposed.

Figure 7E:
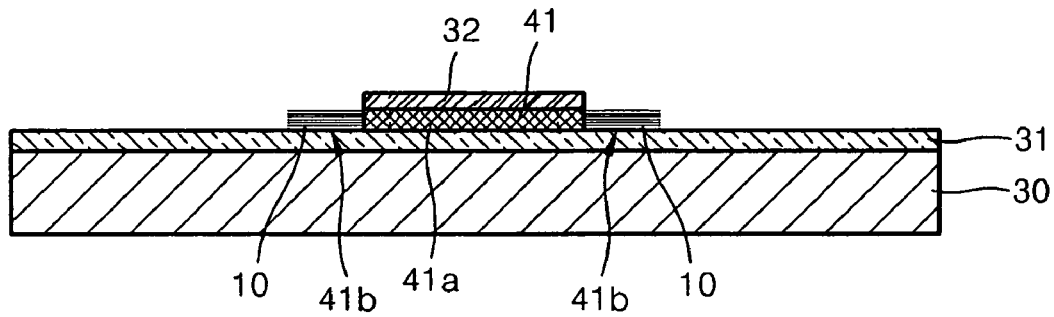

Referring to FIG. 7E, portions of the active layer 41 not covered by the insulation layer 32 are etched. When etching the active layer 41, the polymer materials covering the film 14 and the nano particles 10 in the nano semiconductor sheet 15 are etched. That is, the insulation layer 32 is used as a protection layer or a mask, and the source/drain regions 41b of the active layer 41 are etched to expose the nano particles 10.

Figure 7F:
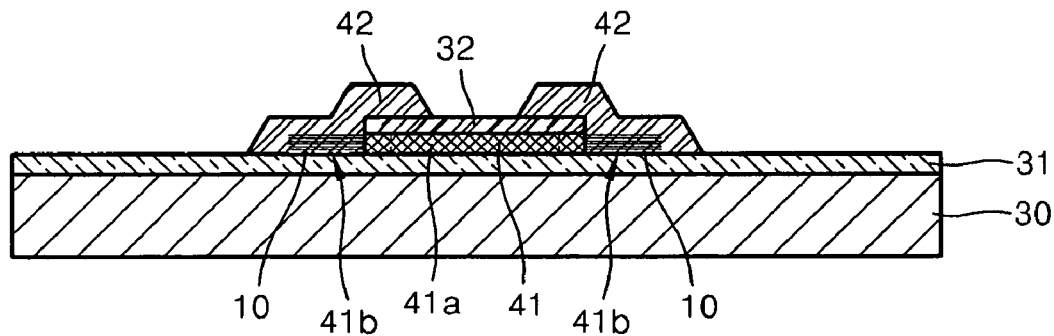
Figure 7G:
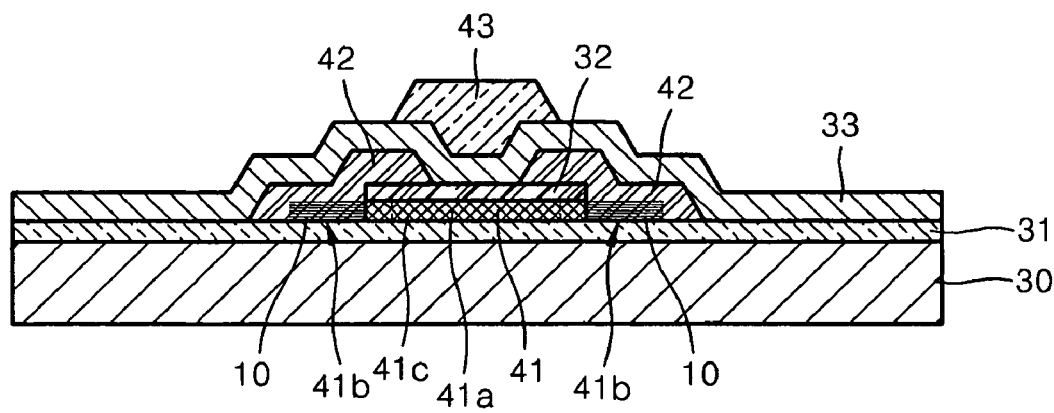

Referring to FIG. 7F, source/drain electrodes 42 are formed to cover the exposed nano particles 10. Referring to FIG. 7G, a gate insulation layer 33 is formed to cover the source/drain electrode 42, the active layer 41, and the insulation layer 32.

The gate insulating layer 33 may include an organic material and/or an inorganic material. The inorganic material may be $SiO_2$, SiNx, SiON, $Al_2O_3$, $TiO_2$, $Ta_2O_5$, $HfO_2$, $ZrO_2$, BST, or PZT. The organic material may be a polymer, for example, poly methyl methcrylate (PMMA) or polystyrene (PS), a polymer having a phenol group, an acryl-based polymer, an imide-based polymer, an arylether-based polymers, an amide-based polymer, a fluorine-based polymer, a p-xylene-based polymer, a vinyl alcohol-based polymer, or a combination thereof. In certain embodiments, a stacked film of inorganic-organic materials may be used.

A gate electrode 43 is formed on the gate insulation layer 33 to overlap with the channel region 41a of the active layer 41.

The source/drain electrodes 42 and the gate electrode 43 may include a metal. In other embodiments, the source/drain electrodes 42 and the gate electrode 43 may include a conductive polymer, a polymer ink having a metal powder, or a conductive polymer having a metal pattern.

In the TFT illustrated in FIG. 7G, the active layer 41 includes a film portion 41c having the nano particles 10. The nano particles 10 in at least a portion of the source and drain regions 41b are exposed. Moreover, an insulation layer 32, which is the protection layer, overlaps with the film portion 41c.

Figure 8A:
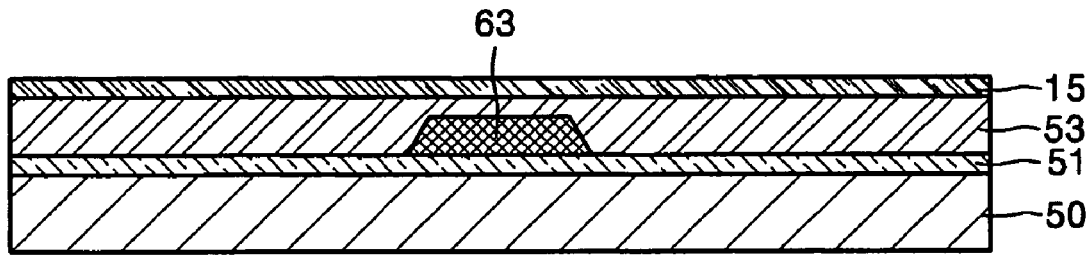
FIGS. 8A through 8F are schematic cross-sectional views illustrating a method of manufacturing a bottom-gate type TFT according to an embodiment.

FIGS. 8A through 8F are cross-sectional views illustrating a method of manufacturing a bottom-gate type TFT according to one embodiment. Referring to FIG. 8A, a gate electrode 63 is formed on a buffer layer 51 formed on a substrate 50. A gate insulation layer 53 is formed to cover the gate electrode 63. The nano semiconductor sheet 15 is adhered to the gate insulation layer 53.

Figure 8B:
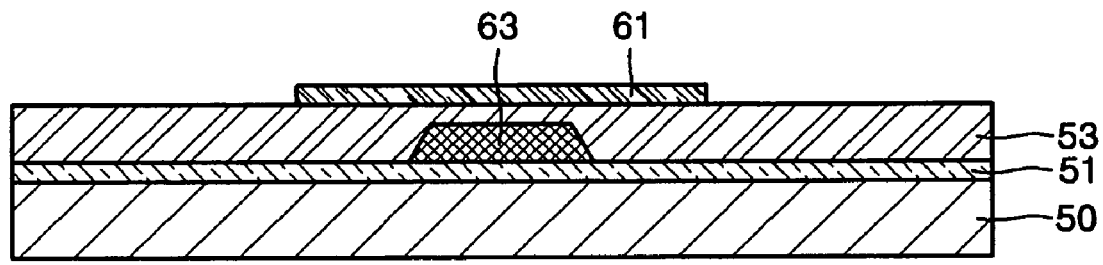
Figure 8C:
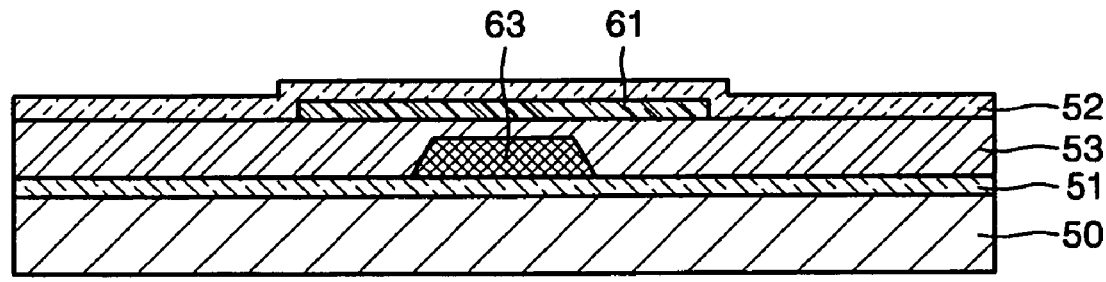

Referring to FIG. 8B, the nano semiconductor sheet 15 is patterned to form an active layer 61. Referring to FIG. 8C, an insulation layer 52 is formed to cover the active layer 61.

Figure 8D:
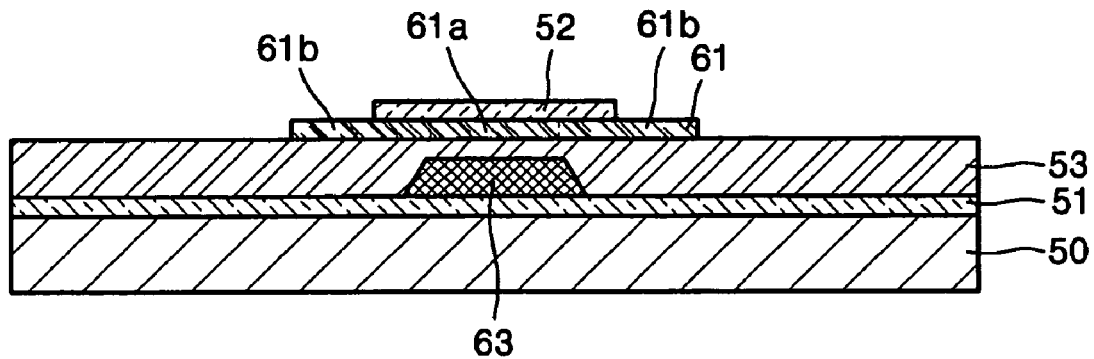

Referring to FIG. 8D, the insulation layer 52 is patterned narrower than the active layer 61. The insulation layer 52 may be only disposed over a channel region 61a of the active layer 61. At least portions of source/drain regions 61b may be exposed.

Figure 8E:
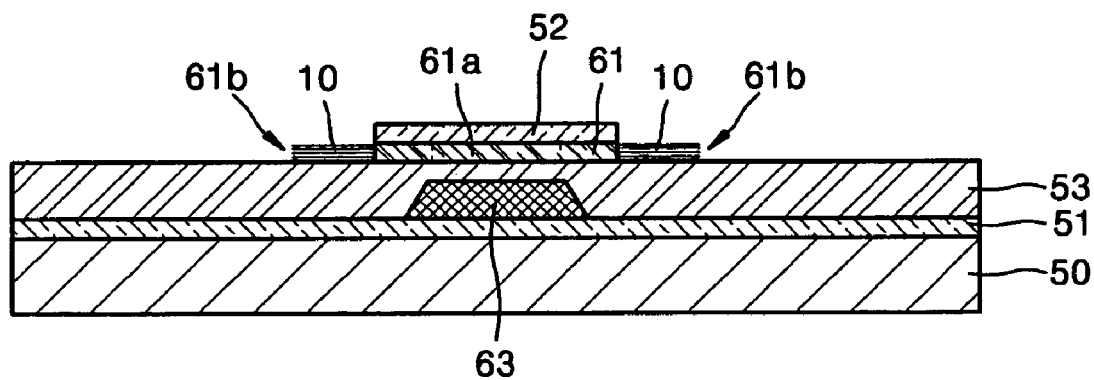

Referring to FIG. 8E, portions of the active layer 61 not covered by the insulation layer 52 are etched. As described above with reference to FIG. 7E, the insulation layer 52 is used as a protection layer or a mask. The source/drain regions 61b of the active layer 61 are etched to expose the nano particles 10 in the active layer 61.

Figure 8F:
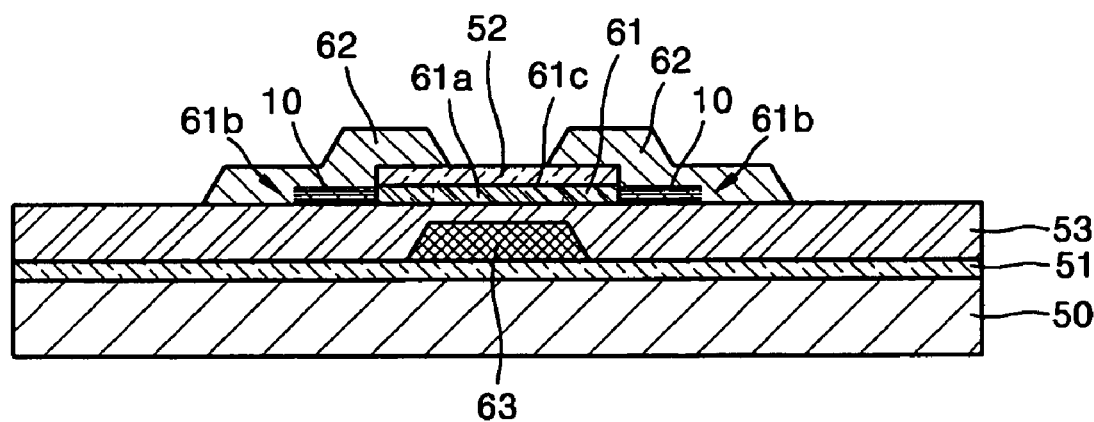

Referring to FIG. 8F, source/drain electrodes 62 are formed to cover the exposed nano particles 10. In the TFT illustrated in FIG. 8F, the active layer 61 includes a film portion 61c having the nano particles 10. The nano particles 10 in at least a portion of the source and drain regions 61b are exposed. Moreover, an insulation layer 62, which is the protection layer, overlaps with the film portion 61c.

The TFTs according to the embodiments described above may be used in a driver of a flat panel display, such as a liquid crystal display (LCD) or an organic light emitting device. The TFTs may also be used in a pixel driving circuit for each pixel.

Figure 9:
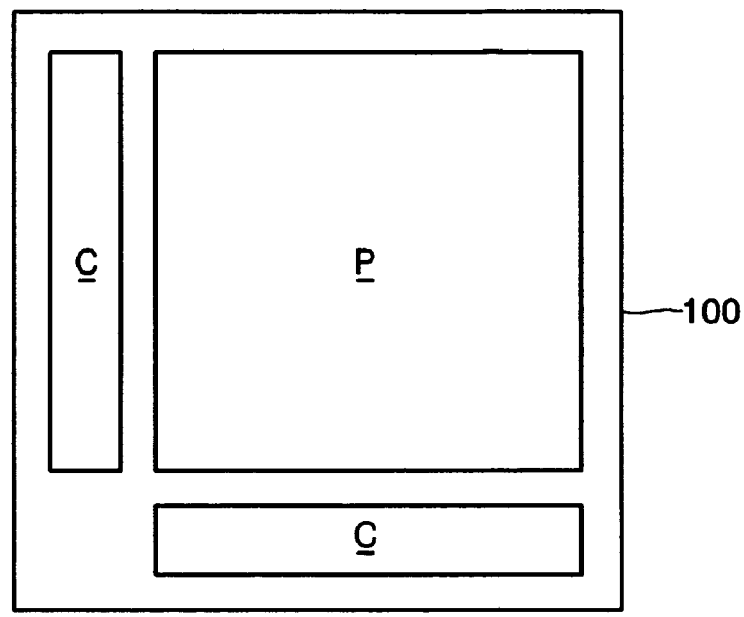
FIG. 9 is a schematic plan view of an active matrix type organic light emitting display according to an embodiment.

FIG. 9 is a schematic plan view of an active matrix type organic light emitting display according to an embodiment. Referring to FIG. 9, the active matrix type organic light emitting display includes a pixel region P disposed on a substrate 100 and circuit regions C disposed along the edges of the pixel region P.

The pixel region P includes a plurality of pixels. Each of the pixels includes a plurality of sub-pixels having organic light emitting devices. In the case of a full color organic light emitting display, red, green and blue sub-pixels are arranged in various shapes, for example, a line shape, a mosaic shape, or a lattice shape, to form pixels. A monochrome flat panel display may have a similar structure.

The circuit regions C is configured to supply electric power to drive the pixel region P and control image signals input to the pixel region P. In the organic light emitting display, at least one TFT may be formed in each of the pixel region P and the circuit region C.

Figure 10:
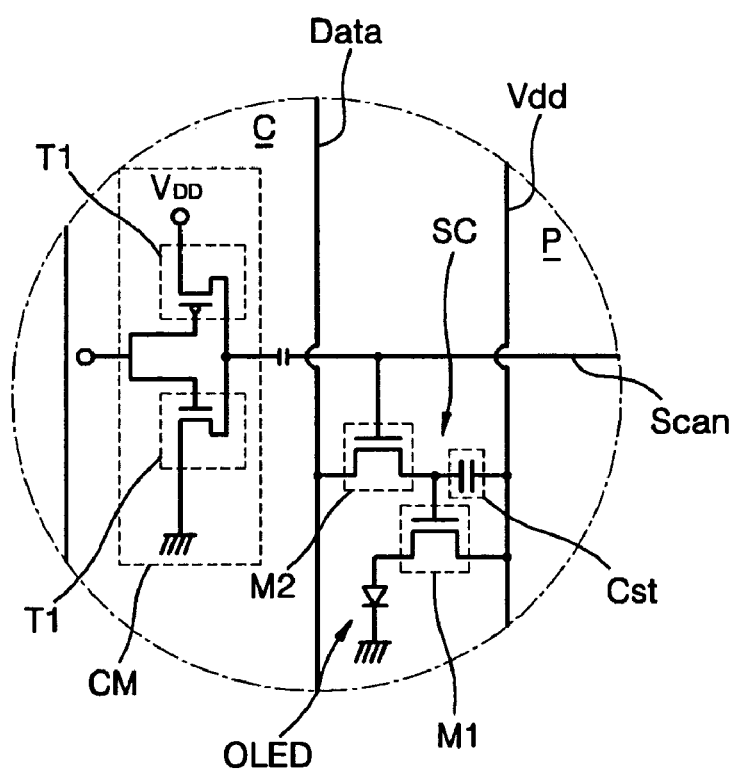
FIG. 10 is a schematic circuit diagram of a pixel driving circuit of a unit pixel in a pixel region and a CMOS TFT of a vertical driver in a circuit region in an active matrix type organic light emitting display according to an embodiment.

FIG. 10 is a schematic circuit diagram of a pixel driving circuit of a unit pixel in a pixel region and a CMOS TFT of a vertical driver in a circuit region in an active matrix type organic light emitting display according to an embodiment. A skilled artisan will appreciate that various other circuit configurations can be adapted for use in an organic light emitting display.

In one embodiment, each pixel driving circuit in a unit pixel includes at least two TFTs including a switching TFT M2 and a driving TFT M1, a storage capacitor Cst, and an organic light emitting device.

The switching TFT M2 is turned on/off in response to a scan signal transmitted through a scan line Scan to transmit a data signal from a data line Data to the storage capacitor Cst and the driving TFT M1. The driving TFT M1 determines the amount of current input to the organic light emitting device in response to the data signal transmitted through the switching TFT M2. The storage capacitor Cst stores the data signal transmitted through the switching TFT M2 for a single frame.

In the illustrated embodiment, the driving TFT M1 and the switching TFT M2 are PMOS TFTs. In another embodiment, at least one of the driving TFT M1 and the switching TFT M2 may be an NMOS TFT. In certain embodiments, more TFTs and capacitors may be included.

A CMOS TFT CM has a structure in which a p-type TFT T1 and an n-type TFT T2 are combined. The vertical driver may or may not include the CMOS TFT CM, and various kinds of TFTs and circuit elements may be connected to form driving circuits.

Figure 11:
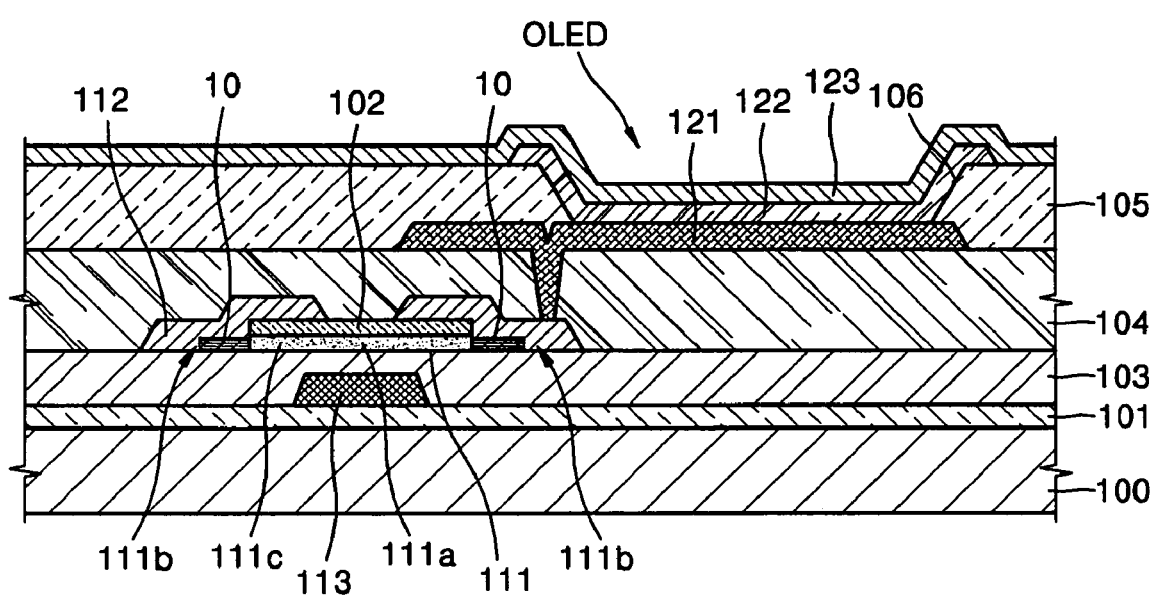
FIG. 11 is a schematic cross-sectional view of a driving TFT and an organic light emitting device of the circuit diagram illustrated in FIG. 10.

FIG. 11 is a cross-sectional view of a driving TFT and an organic light emitting device of the circuit illustrated in FIG. 10. The illustrated TFT is a bottom-gate type TFT. In other embodiments, however, configurations described below can be adapted for the top-gate type TFT of FIG. 7G, or various other transistors.

Referring to FIG. 11, a gate electrode 113 is formed on a buffer layer 101 formed on a substrate 100. A gate insulation layer 103 is formed to cover the gate electrode 113. In addition, an active layer 111 having the nano semiconductor sheet 15 is formed on the gate insulation layer 103. An insulation layer 102 is disposed on the active layer 111, overlapping with a film portion 111c of the active layer. The nano particles 10 disposed in a portion of source/drain regions 111b of the active layer 111 are exposed. Source/drain electrodes 112 cover the exposed nano particles 10.

A planarization layer 104 with a via hole formed therein covers the TFT. A first electrode layer 121 of an organic light emitting device is formed on the planarization layer 104, and contacts one of the source/drain electrodes 112 through the via hole.

A pixel definition layer 105 covers the planarization layer 104 and first electrode layer 121. An aperture 106 is formed in the pixel definition layer 105 to expose a predetermined portion of the first electrode layer 121.

An organic emission layer 122 and a second electrode layer 123 are sequentially formed on the exposed portion of the first electrode layer 121. In other embodiments, the active matrix type organic light emitting display may have various other structures.

In one embodiment, the first electrode layer 121 of the organic light emitting device is patterned to be only over pixels whereas the second electrode layer 123 is formed over the entire display region. In other embodiments, the second electrode layer 123 may also be patterned to be only over pixels.

The first electrode layer 121 functions as an anode electrode and the second electrode layer 123 functions as a cathode electrode. The polarities of the first electrode layer 121 and the second electrode layer 123 may be reversed.

The first electrode layer 121 may be a transparent electrode or a reflective electrode. The transparent electrode may include ITO, IZO, ZnO, or $In_2O_3$. The reflective electrode may include a reflective layer formed of Ag, Mg, Al, Pt, Pd, Au, Ni, Nd, Ir, Cr, or a compound thereof, and a layer formed of ITO, IZO, ZnO, or $In_2O_3$ formed on the reflective layer.

The second electrode layer 123 may be a transparent electrode or a reflective electrode. When the transparent electrode is employed, the second electrode layer 123 may serve as a cathode electrode. Such a transparent electrode may be formed as follows. A material having a low work function, is deposited on the organic emission layer 122. Examples of a low work function material include Li, Ca, LiF/Ca, LiF/Al, Al, Mg, and a compound thereof. Then, a transparent electrode forming material, for example, ITO, IZO, ZnO, or $In_2O_3$, is formed thereon to form a subsidiary electrode layer or a bus electrode line. When the reflective electrode is employed, Li, Ca, LiF/Ca, LiF/Al, Al, Mg, or a compound thereof is used.

The organic emission layer 122 may include a low molecular organic layer or a polymer organic layer. When the low molecular organic layer is employed, a hole injection layer (HIL), a hole transport layer (HTL), an organic emission layer (EML), an electron transport layer (ETL), and an electron injection layer (EIL) may be deposited to have a single- or multi-layered structure. An organic materials used for the low molecular organic layer may be, for example, copper phthalocyanine (CuPc), NPB (N,N'-Di(naphthalene-1-yl)-N,N'-diphenyl-benzidine), or tris-8-hydroxyquinoline aluminum (Alq3). The low molecular organic layer may be formed using a vacuum deposition method.

When the polymer organic layer is employed, the organic emission layer 122 may include an HTL and an EML. The HTL may be formed of PEDOT, and the EML may be formed of a polymer organic material, such as poly-phenylenevinylene (PPV) or polyfluorene. The HTL and EML may be formed using screen printing or inkjet printing. After forming the organic light emitting device, the structure is sealed using sealing member.

In other embodiments, the structures and methods described above may be adapted for use with other display devices. Examples of such display devices include, but are not limited to, liquid crystal displays, inorganic electro-luminescent display devices, etc.

The embodiments described above provide the following advantages. First, TFTs having excellent characteristics as a result of the characteristics of nano particles can be obtained. Second, since nano particles are used in channels of TFTs, transistors and flat panel displays, in particular, organic light emitting displays, can be manufactured at room temperature or low temperatures without high temperature processing. Third, accordingly, plastic materials that are not suitable for a high temperature treatment can be used for flat panel displays, and thus, flexible flat panel display can be manufactured at a low temperature.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. An electronic device comprising:
   a substrate; and
   a thin film transistor formed over the substrate, the thin film transistor comprising:
      an active layer including a channel region, a source region and a drain region, wherein the channel region comprises a plurality of microfibers extending generally in a direction, the microfibers comprising nanoparticles and a polymer, and the source and drain regions comprise a plurality of microfibers extending generally in a direction, the microfibers containing nanoparticles therein;
      a gate electrode;
      an insulating layer interposed between at least the channel region and the gate electrode;
      a source electrode in contact with the nanoparticles of the source region; and a drain electrode in contact with the nanoparticles of the drain region.

2. The device of claim 1, wherein the plurality of microfibers extends generally between the source region and the drain region.

3. The device of claim 1, wherein the nanoparticles are aligned generally in a direction extending between the source region and the drain region.

4. The device of claim 1, wherein the source region and the drain region further comprise a trace amount of the polymer.

5. The device of claim 1, wherein the active layer further comprises another plurality of microfibers extending in another direction, and wherein the other plurality of microfibers comprises substantially no nanoparticles.

6. The device of claim 1, further comprising a photoresist layer formed on at least a portion of a surface of the channel.

7. A method of making a thin film transistor, the method comprising:

provide a substrate;

placing a nano semiconductor sheet over the substrate, the sheet comprising a plurality of microfibers extending generally in a direction, the microfibers comprising a polymer and nanoparticles contained in the polymer;

selectively removing the polymer from at least one portion of the semiconductor layer so as to expose the nanoparticles in the at least one portion, thereby defining source and drain regions; and forming source and drain electrodes contacting at least part of the exposed nanoparticles in the source and drain regions.

8. The method of claim 7, wherein selectively removing the polymer comprises:

forming a photoresist layer over the sheet;

patterning the photoresist layer to open the source and drain regions while blocking a channel region interposed between the source and drain regions; and selectively etching the polymer from the source and drain regions while leaving the nanoparticles in the source and drain regions.

9. The method of claim 8, wherein the method does not comprise removing the patterned photoresist layer after selectively etching the polymer.

* * * * *